(12) United States Patent
Song et al.

(10) Patent No.: US 8,419,461 B2
(45) Date of Patent: Apr. 16, 2013

(54) SOCKET CONNECTOR

(75) Inventors: Yong-Jun Song, Shenzhen (CN);
Yong-Zhao Huang, Shenzhen (CN)

(73) Assignees: **Hong Fu Jin Precision Industry
(ShenZhen) Co., Ltd.**, Shenzhen (CN);
Hon Hai Precision Industry Co., Ltd.,
New Taipei (TW)

( * ) Notice: Subject to any disclaimer, the term of this patent is extended or adjusted under 35 U.S.C. 154(b) by 30 days.

(21) Appl. No.: 13/193,618

(22) Filed: Jul. 29, 2011

(65) Prior Publication Data
US 2012/0302083 A1 Nov. 29, 2012

(30) Foreign Application Priority Data

May 26, 2011 (CN) .......................... 2011 1 0137981

(51) Int. Cl.
*H01R 13/625* (2006.01)
(52) U.S. Cl.
USPC ......................................... 439/345; 439/135
(58) Field of Classification Search .................... 439/68,
439/70, 71, 73, 329, 330, 331, 342, 345,
439/135, 940
See application file for complete search history.

(56) References Cited

U.S. PATENT DOCUMENTS

| | | | | |
|---|---|---|---|---|
| 6,155,878 A * | 12/2000 | Chen | ......................... | 439/607.01 |
| 6,319,062 B1 * | 11/2001 | Ma et al. | ................... | 439/607.38 |
| 6,685,494 B1 * | 2/2004 | McHugh et al. | .............. | 439/342 |
| 6,805,562 B2 * | 10/2004 | Liao et al. | ........................ | 439/68 |
| 7,556,522 B2 * | 7/2009 | Ma | ................... | 439/342 |
| 7,566,229 B2 * | 7/2009 | Ma | .................... | 439/71 |
| 7,972,170 B2 * | 7/2011 | Tsujimoto | .................. | 439/541.5 |

* cited by examiner

*Primary Examiner* — Thanh Tam Le
(74) *Attorney, Agent, or Firm* — Altis Law Group, Inc.

(57) ABSTRACT

A socket connector includes a main body, a fastener for locking an electric element on the main body, and a cover. The fastener includes a fixed plate defining a through hole. The fixed plate includes two opposite inner sidewalls. A first slide rail protrudes inward from one inner sidewall, and a second slide rail protrudes inward from the other inner sidewall. The cover includes two blocks. Each of the blocks includes an L-shaped main portion and a stop portion connected to L-shaped main portion. The L-shaped main portion and the stop portion of each block cooperatively define a slide groove. The first rail and the second rail slide into the slide grooves, respectively, and are stopped by the corresponding stop portions, such that the cover is detachably positioned on the fixed plate.

20 Claims, 4 Drawing Sheets

SOCKET CONNECTOR

BACKGROUND

1. Technical Field

The present disclosure relates to a socket connector.

2. Description of Related Art

Socket connectors come out of the factory packaged with covers for protecting electrical terminals from damage. When a user arranges an electric element (e.g. a memory, a microprocessor, a CPU) on a socket connector, the cover must be stripped.

However, because the cover is directly on the socket connector, the electrical terminals may be damaged if the cover is carelessly stripped off.

Therefore, what is needed is a new socket connector that can overcome the described limitations.

DETAILED DESCRIPTION

Embodiments will now be described in detail with reference to drawings.

Figure 1:
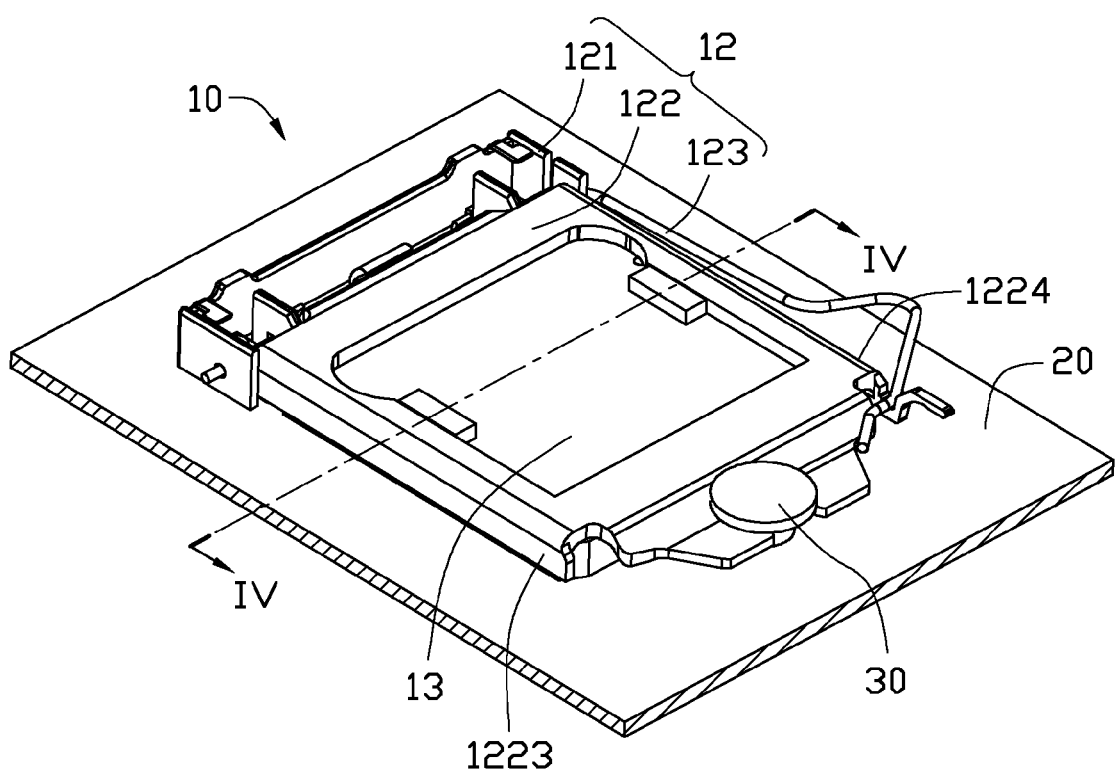
FIG. 1 is an isometric view of a socket connector according to an exemplary embodiment.
Figure 2:
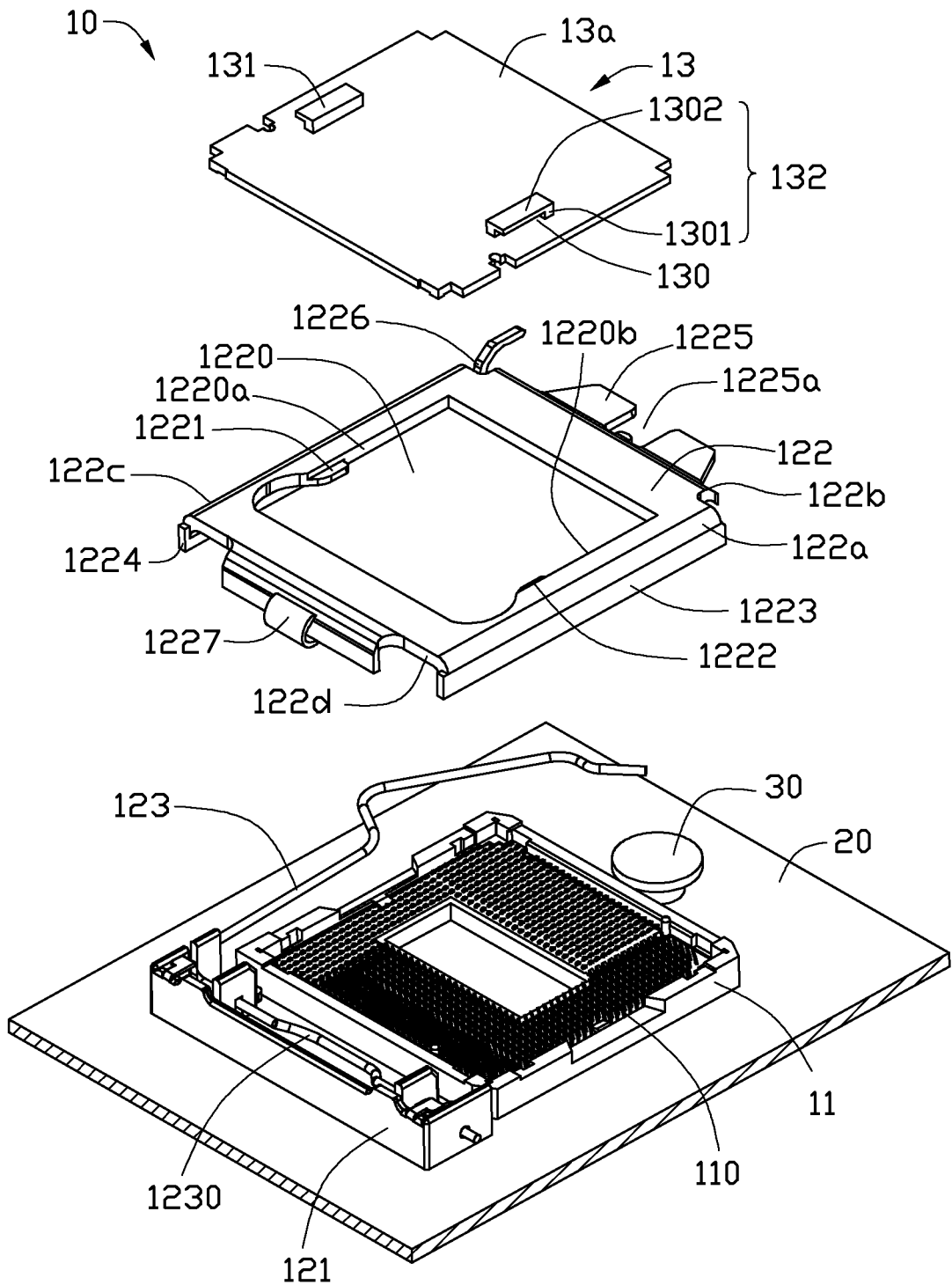
FIG. 2 is an exploded isometric view of the socket connector of FIG. 1.
Figure 3:
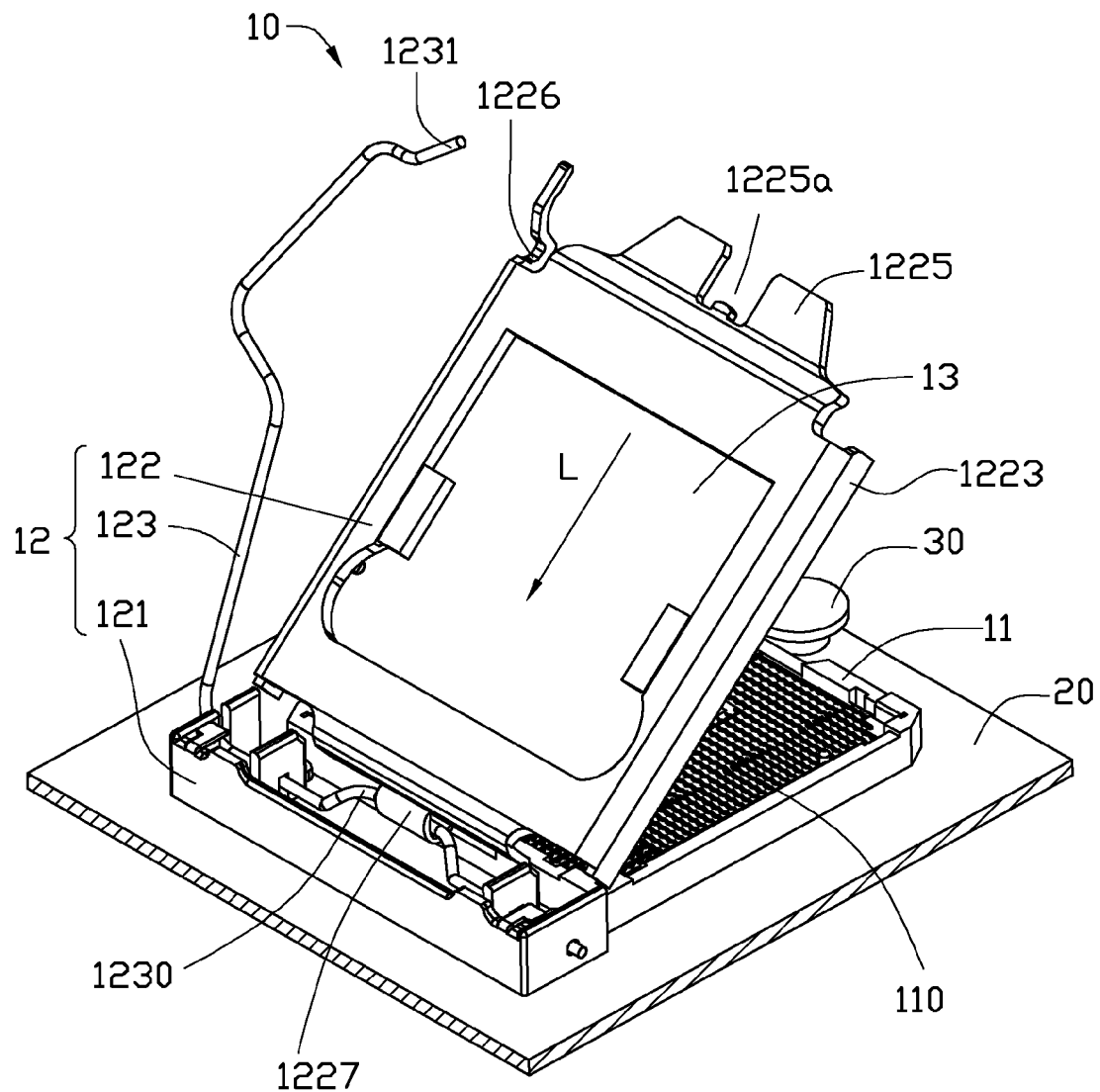
FIG. 3 is an exploded isometric view of the socket connector of FIG. 1 viewed from another aspect.
Figure 4:
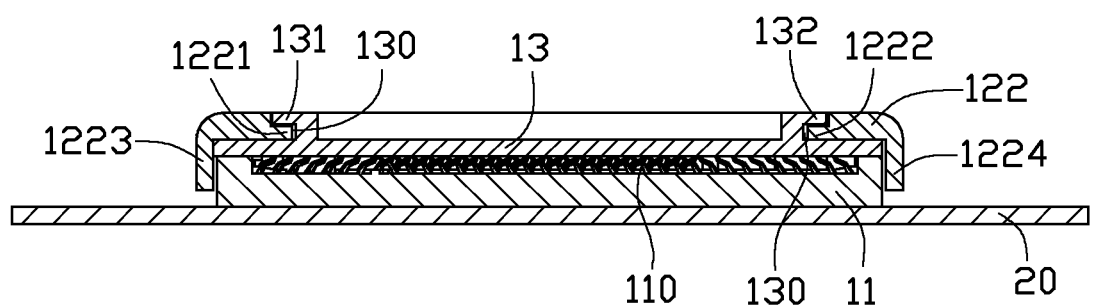
FIG. 4 is a cross sectional view of the socket connector of FIG. 1, taken along line IV-IV.

Referring to FIGS. 1-4, a socket connector 10, in accordance with an exemplary embodiment, includes a main body 11, a fastener 12, and a cover 13.

The main body 11 is a substantially square structure, and is soldered on a circuit board 20 by a ball-grid array package. A plurality of electric terminals 110 are arranged in the main body 11, and are electrically connected to the circuit board 20. The electrical terminals 110 of the main body 11 electrically connect the circuit board 20 to an electric element (not shown). In the present embodiment, the electric element is a micro processor. In other embodiments, the electric element may be a CPU, or a memory.

The fastener 12 includes a base 121, a fixed plate 122, and a pendulum rod 123. The fixed plate 122 is rotationally connected to the base 121 with the pendulum rod 123.

The base 121 is fixed to the circuit board 20 with screws (not shown). The base 121 is near one end of the main body 11, such that the fastener 12 can be fixed to the circuit board 20, to lock the electric element on the main body 11.

The pendulum rod 123 is arranged on the base 121, and includes a U-shaped bending portion 1230. The bending portion 1230 is engaged with the fixed plate 122, and is rotatable relative to the base 121.

The fixed plate 122 is a substantially square structure, and includes a first sidewall 122a, a second sidewall 122b, and a third sidewall 122c opposite to the first sidewall 122a, as well as a fourth sidewall 122d opposite to the second sidewall 122b. A through hole 1220 is defined in the fixed plate 122 for exposing the electric terminals 110, such that the electric element on the main body 11 can be exposed. In the present embodiment, the shape of the through hole 1220 is similar to that of the cover 13, and is a substantially square structure. The cover 13 is larger than the through hole 1220.

A first slide rail 1221 protrudes inward from a portion of a first inner wall 1220a. A second slide rail 1222 protrudes inward from a portion of a second inner wall 1220b opposite to the first slide rail 1221. In detail, the first slide rail 1221 protrudes inwardly into the through hole 1220 from a portion of a first inner wall 1220a. A second slide rail 1222 protrudes inwardly into the through hole 1220 from a portion of a second inner wall 1220b opposite to the first slide rail 1221 (see FIGS. 2 and 4).

A first limitation plate 1223 protrudes downward from the first sidewall 122a. A second limitation plate 1224 protrudes downward from the third sidewall 122c (see FIG. 2). The first limitation plate 1223 and the second limitation plate 1224 cooperatively limit the main body 11 in a space, which is defined by the first limitation plate 1223 and the second limitation plate 1224.

A locking plate 1225 horizontally protrudes from the second sidewall 122b. A notch 1225a is defined in a central portion of the locking plate 1225. A U-shaped coupling portion 1226 is arranged on an end of the second limitation plate 1224, which is near to the second sidewall 122b. A hook 1227 is arranged on a central portion of the fourth sidewall 122d. The hook 1227 is sleeved over the bending portion 1230, such that the fixed plate 122 can move with the pendulum rod 123.

When the fastener 12 is locked on the main body 11, a portion of the pendulum rod 123, which is exposed outside, is pressed towards the circuit board 20. Then, the bending portion 1230 supplies a forward force to the fixed plate 122, such that the fixed plate 122 moves toward the circuit board 20. A screw 30 passes through the notch 1225a and presses the locking plate 1225 towards the circuit board 20 to secure the fixed plate 122 on the circuit board 20. Next, an end 1231 of the pendulum rod 123, which is away from the base 121, is locked in the U-shaped coupling portion 1226, such that the pendulum rod 123 can be fixed on the fixed plate 122. When the fixed plate 122 is departed from the circuit board 20, the end 1231 is first departed from the coupling portion 1226, then, pulled away from the circuit board 20. Accordingly, the bending portion 1230 supplies a backward force to the hook 1227, such that the screw 30 moves out of the notch 1225a, and the fixed plate 122 is raised. The main body 11 can thus be exposed.

The cover 13 is detachably fixed on the fastener 12, and includes a top surface 13a and a bottom surface (not labeled) facing away from the top surface 13a. Two blocks 131 are arranged on the top surface 13a.

Each block 131 includes an L-shaped main portion 1302 and a stop portion 1301 connected to one end of the L-shaped main portion 1302. The L-shaped main portion 1302 and the stop portion 1301 cooperatively define a slide groove 130. Accordingly, one end of the slide groove 130 is opened, and the other end of the slide groove 130 is closed. Each of the first and second slide rails 1221, 1222 is received in the slide groove 130, and can be stopped by the stop portion 1301.

When the cover 13 is fixed on the fixed plate 122, the cover 13 is firstly positioned between the fixed plate 122 and the main body 11, and the first slide rail 1221 and the second rail 1222 are aligned with the slide grooves 130 of the blocks 131, respectively. Then, the cover 13 is pushed along L direction, such that the first slide rail 1221 and the second rail 1222 can slide in the slide grooves 130 of the blocks 131, respectively. When the first slide rail 1221 and the second rail 122 contact with the stop portions 1301 of the blocks 131, respectively, the cover 13 is fixed on the fixed plate 122. After the cover 13 is fixed on the fixed, and when the fastener 12 is locked on the main body 11, the bottom surface of the cover 13 faces the main body 11 (see FIGS. 1 and 4).

After the electric element is positioned on the main body 11, the cover 13 can be pulled along a direction opposite to the L direction, such that the cover 13 can be easily removed from the fixed plate 122. Accordingly, the electric element can be exposed.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A socket connector comprising:
   a main body;
   a fastener configured to lock an electric element on the main body, the fastener comprising a fixed plate having a through hole defined therein, the fixed plate comprising a first inner sidewall, a second inner sidewall opposite to the first inner sidewall, a first slide rail protruding inwardly into the through hole from the first inner sidewall, and a second slide rail protruding inwardly into the through hole from the second inner sidewalk the first and second inner sidewalls being positioned around the through hole; and
   a cover comprising two blocks, each block comprising a L-shaped main portion and a stop portion connected to L-shaped main portion, the L-shaped main portion and the stop portion of each block cooperatively defining a slide groove, the first rail and the second rail sliding into the slide grooves of the two blocks and being stopped by the stop portions of the two blocks, such that the cover is detachably positioned on the fixed plate.

2. The socket connecter of claim 1, wherein the fixed plate is a substantially square structure, and comprises a first sidewall, a second sidewall, and a third sidewall opposite to the first sidewall, as well as a fourth sidewall opposite to the second sidewall.

3. The socket connector of claim 2, wherein the fixed plate further comprises a first limitation plate protruding downward from the first sidewall, a second limitation plate protruding downward from the third sidewalk, and a U-shaped coupling portion being arranged on an end of the second limitation plate which is near to the second sidewall, the first limitation plate and the second limitation plate are configured to cooperatively limit the main body, the fastener further comprises a base and a pendulum rod, the base is positioned near one end of the main body, and the fixed plate is rotationally connected to the base with the pendulum rod, the U-shaped coupling portion is configured for locking an end of the pendulum rod which is away from the base therein, thereby making the pendulum rod be fixed on the fixed plate.

4. The socket connector of claim 3, wherein the fixed plate further comprises a hook arranged on the fourth sidewall, and the hook is engaged with the pendulum rod, such that the fixed plate is rotatable relative to the base.

5. The socket connector of claim 4, wherein the pendulum rod comprises a bending portion rotatably connected to the base, and the hook is sleeved over the bending portion.

6. The socket connector of claim 4, wherein the fixed plate further comprises a locking plate horizontally protruding from the second sidewall, and the locking plate defines a notch.

7. The socket connector of claim 6, wherein the main body is soldered on a circuit board, the socket connector further comprising a screw, and the screwing passing through the notch for pressing the locking plate towards the circuit board to secure the fixed plate on the circuit board.

8. The socket connector of claim 2, wherein the cover comprises a top surface and a bottom surface facing away from the top surface, the two blocks are arranged on the top surface, when the cover is fixed on the fixed plate and the fastener is locked on the main body, the bottom surface faces the main body.

9. The socket connector of claim 8, wherein the fastener further comprises a base and a pendulum rod, the base is positioned near one end of the main body, and the fixed plate is rotationally connected to the base with the pendulum rod.

10. The socket connector of claim 9, wherein the fixed plate further comprises a hook arranged on the fourth sidewall, and the hook is engaged with the pendulum rod, such that the fixed plate is rotatable relative to the base.

11. The socket connector of claim 10, wherein the pendulum rod comprises a bending portion rotatably connected to the base, and the hook is sleeved over the bending portion.

12. The socket connector of claim 10, wherein the fixed plate further comprises a locking plate horizontally protruding from the second sidewall, and the locking plate defines a notch.

13. The socket connector of claim 12, wherein the main body is soldered on a circuit board, the socket connector further comprising a screw, and the screwing passing through the notch for pressing the locking plate towards the circuit board to secure the fixed plate on the circuit board.

14. A socket connector comprising:
    a main body:
    a fastener configured to lock an electric element on the main body, the fastener comprising a fixed plate having a through hole defined therein, the fixed plate comprising a first inner sidewall, a second inner sidewall opposite to the first inner sidewall, a first slide rail protruding inward from the first inner sidewall, and a second slide rail protruding inward from the second inner sidewall, the first and second inner sidewalls being positioned around the through hole, the fixed plate being a substantially square structure, and comprising a first sidewall, a second sidewall, and a third sidewall opposite to the first sidewall, as well as a fourth sidewall opposite to the second sidewall, the fixed plate further comprising a first limitation plate protruding downward from the first sidewall, and a second limitation plate protruding downward from the third sidewall, the first limitation plate and the second limitation plate being configured to cooperatively limit the main body; and
    a cover comprising two blocks, each block comprising a L-shaped main portion and a stop portion connected to L-shaped main portion, the L-shaped main portion and the stop portion of each block cooperatively defining a slide groove, the first rail and the second rail sliding into the slide grooves of the two blocks and being stopped by the stop portions of the two blocks, such that the cover is detachably positioned on the fixed plate.

15. The socket connector of claim 14, wherein the fastener further comprises a base and a pendulum rod, the base is positioned near one end of the main body, and the fixed plate is rotationally connected to the base with the pendulum rod.

16. The socket connector of claim 15, wherein the fixed plate further comprises a hook arranged on the fourth sidewall, and the hook is engaged with the pendulum rod, such that the fixed plate is rotatable relative to the base.

17. The socket connector of claim 16, wherein the pendulum rod comprises a bending portion rotatably connected to the base, and the hook is sleeved over the bending portion.

18. The socket connector of claim 16, wherein the fixed plate further comprises a locking plate horizontally protruding from the second sidewall, and the locking plate defines a notch.

19. The socket connector of claim 14, wherein the cover comprises a top surface and a bottom surface facing away from the top surface, the two blocks are arranged on the top surface, when the cover is fixed on the fixed plate and the fastener is locked on the main body, the bottom surface faces the main body.

20. The socket connector of claim 14, wherein the main body is soldered on a circuit board, the socket connector further comprising a screw, and the screwing passing through the notch for pressing the locking plate towards the circuit board to secure the fixed plate on the circuit board.

* * * * *